United States Patent
Eom et al.

(10) Patent No.: US 11,189,780 B2
(45) Date of Patent: Nov. 30, 2021

(54) ANISOTROPIC STRAIN-DRIVEN MAGNETOELECTRIC DEVICES

(71) Applicant: WISCONSIN ALUMNI RESEARCH FOUNDATION, Madison, WI (US)

(72) Inventors: Chang-Beom Eom, Madison, WI (US); Mark Steven Rzchowski, Madison, WI (US); Julian James Irwin, Madison, WI (US); Shane Martin Lindeman, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 16/387,898

(22) Filed: Apr. 18, 2019

(65) Prior Publication Data

US 2020/0335690 A1  Oct. 22, 2020

(51) Int. Cl.

| H01L 41/20 | (2006.01) |
|---|---|
| H01L 27/22 | (2006.01) |
| H01L 27/20 | (2006.01) |
| H01L 41/37 | (2013.01) |
| H01L 43/12 | (2006.01) |
| H01L 41/18 | (2006.01) |
| H01L 41/12 | (2006.01) |
| H01L 43/02 | (2006.01) |

(52) U.S. Cl.
CPC .............. *H01L 41/20* (2013.01); *H01L 27/20* (2013.01); *H01L 27/222* (2013.01); *H01L 41/12* (2013.01); *H01L 41/183* (2013.01); *H01L 41/37* (2013.01); *H01L 43/02* (2013.01); *H01L 43/12* (2013.01)

(58) Field of Classification Search
CPC ....... H01L 41/12; H01L 41/183; H01L 41/37; H01L 43/02; H01L 27/20; H01L 27/222
See application file for complete search history.

(56) References Cited

U.S. PATENT DOCUMENTS

| 6,387,476 B1 * | 5/2002 | Iwasaki | G11B 5/00 428/212 |
|---|---|---|---|
| 6,483,741 B1 * | 11/2002 | Iwasaki | G11C 11/1675 365/170 |
| 9,166,147 B2 | 10/2015 | Carman et al. | |
| 9,685,214 B2 | 6/2017 | Lynch et al. | |

(Continued)

OTHER PUBLICATIONS

D'Souza et al., "Energy-efficient switching of nanomagnets for computing: Straintronics and other methodologies," Nanotechnology, vol. 29, No. 44, Aug. 29, 2018, pp. 1-112.

(Continued)

*Primary Examiner* — Matthew E. Gordon
(74) *Attorney, Agent, or Firm* — Bell & Manning, LLC; Michelle Manning (57) ABSTRACT

Magnetoelectric devices based on piezoelectric/magnetostrictive bilayers are provided. Also provided are methods of using the devices to modulate or to sense the magnetization of the magnetostrictive material. The devices include an island of magnetostrictive material that is strain-coupled to a thin layer of a piezoelectric material at an interface. A bottom electrode is placed in electrical communication with one surface of the piezoelectric film, and an unpaired top electrode is placed in electrical communication with a second, opposing surface of the piezoelectric film.

23 Claims, 8 Drawing Sheets

(56) References Cited

U.S. PATENT DOCUMENTS

2014/0042574 A1* 2/2014 Carman .............. H01L 43/10
257/421
2015/0311434 A1* 10/2015 Loong ................ G01R 33/0052
257/421

OTHER PUBLICATIONS

Cui et al., "Generation of localized strain in a thin film piezoelectric to control individual magnetoelectric heterostructures," Applied Physics Letters, vol. 107, Aug. 2015, pp. 092903-1 to 092903-5.

Liang et al., Electrical control of a single magnetoelastic domain structure on a clamped piezoelectric thin film—analysis, Journal of Applied Physics, vol. 116, 2014, pp. 123909-1 to 123909-9.

Cui et al., "A method to control magnetism in individual strain-mediated magnetoelectric islands," Appl. Phys. Lett. 103, 232905 (2013); https://doi.org/10.1063/1.4838216.

Hu et al., "Electric-field control of strain-mediated magnetoelectric random access memory," Journal of Applied Physics 107, pp. 093912-1 to 093912-10 2010.

Irwin J, Lindemann S, Maeng W, Wang JJ, Vaithyanathan V, Hu JM, Chen LQ, Schlom DG, Eom CB, Rzchowski MS. Magnetoelectric Coupling by Giant Piezoelectric Tensor Design. arXiv preprint arXiv:1901.02456. Jan. 8, 2019.

Palneedi et al., "Status and Perspectives of Multiferroic Magnetoelectric Composite Materials and Applications," Actuators, vol. 5, No. 9, 2016, pp. 1-31.

Nan et al., "Multiferroic magnetoelectric composites: Historical perspective, status, and future directions," Journal of Applied Physics, vol. 103, 2008, pp. 031101-1 to 031101-34.

Wang et al., "Multiferroic magnetoelectric composite nanostructures," NPG Asia Mater, vol. 2, 2010, pp. 61-68.

Yu et al., "Voltage-Driven 180° Magnetization Switching in Magnetoelectric Heterostructures," IEEE Transactions on Magnetics, vol. 53, No. 11, Nov. 2017, 5 pages-.

Wang et al., "Full 180u Magnetization Reversal with Electric Fields," Scientific reports, vol. 4, 2014, 5 pages.

Ma, Jing, et al. "Recent progress in multiferroic magnetoelectric composites: from bulk to thin films." *Advanced Materials* 23.9 (2011): 1062-1087.

Eshelby, John Douglas. "The determination of the elastic field of an ellipsoidal inclusion, and related problems." *Proceedings of the Royal Society of London. Series A. Mathematical and Physical Sciences* 241.1226 (1957): 376-396.

Kundu, Auni A., et al. "360 deterministic magnetization rotation in a three-ellipse magnetoelectric heterostructure." *Journal of Applied Physics* 123.10 (2018): 10415-01 to 104105-7.

* cited by examiner

ANISOTROPIC STRAIN-DRIVEN MAGNETOELECTRIC DEVICES

REFERENCE TO GOVERNMENT RIGHTS

This invention was made with government support under W911NF-17-1-0462 awarded by the ARMY/ARO. The government has certain rights in the invention.

BACKGROUND

Magnetoelectric materials systems possess a wide range of applications including non-volatile memories, magnetic field sensors, spintronics, tunable radiofrequency (RF) circuit elements, tunable optics, and biomedical devices. Significant effort has been devoted towards the few known materials exhibiting single-phase room temperature magnetoelectricity, but these materials have drawbacks such as weak magnetoelectric coupling or small electric polarizations. Composite magnetoelectrics, consisting of a ferromagnet coupled to a piezoelectric via strain, are a well-studied alternative to single phase magnetoelectrics. Composite magnetoelectrics have the largest reported magnetoelectric coupling constants and suitable electric polarizations, magnetic coercive fields, and saturation magnetizations. These characteristics make them highly promising device candidates, but up to this point they have been challenging to implement in thin-film form.

The first challenge arises from substrate clamping that virtually eliminates the in-plane piezoelectric response of thin films, and the second challenge arises from the in-plane four-fold symmetry of most (001) piezoelectrics that precludes the anisotropic in-plane strain necessary for in-plane magnetization rotation. Substrate clamping has limited the majority of composite magnetoelectric research to bulk piezoelectrics. Nanoscale patterning has been shown to partially address this by relaxing the island through its thickness, but such nano-structuring can introduce unwanted defects such as ion implantation and dislocations. Special crystalline orientations, domain switching, and extra top electrodes have addressed the in-plane symmetry limitation but result in complexity and fabrication challenges.

SUMMARY

Magnetoelectric devices based on piezoelectric/magnetostrictive bilayers are provided. Also provided are methods of using the devices to modulate the magnetization of the magnetostrictive material or to sense modulation of the magnetization of the magnetostrictive material.

One embodiment of a magnetoelectric device includes: a layer of piezoelectric material; an island of magnetostrictive material that is strain-coupled to the layer of piezoelectric material; a bottom electrode in electrical communication with a first surface of the layer of piezoelectric material; and an unpaired top electrode in electrical communication with a second surface of the layer of piezoelectric material. The bottom electrode and the unpaired top electrode are configured to apply an electric field through the thickness of the layer of piezoelectric material in a biased region or to sense an electric field generated through the thickness of the layer of piezoelectric material in a biased region. The biased region has an aspect ratio greater than one and is surrounded by an unbiased region.

One embodiment of a method of reorienting the direction of magnetization in a magnetostrictive material in a magnetoelectric device, as described here, includes the step of applying an out-of-plane electric field through the thickness of the layer of piezoelectric material, wherein the application of the out-of-plane electric field induces the direction of magnetization in the magnetostrictive material to undergo an in-plane rotation from a first in-plane direction to a second in-plane direction.

One embodiment of a method of sensing the direction of magnetization in a magnetostrictive material using a magnetoelectric device, as described here, includes the steps of: exposing the magnetostrictive material to an external magnetic field that rotates the direction of magnetization in the plane of the magnetostrictive material, inducing an out-of-plane electric field through the thickness of the layer of piezoelectric material; and detecting the electric field.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Magnetoelectric devices based on piezoelectric/magnetostrictive bilayers are provided. Also provided are methods of using the devices to modulate the magnetization of the magnetostrictive material or to sense modulation of the magnetization of the magnetostrictive material. The magnetoelectric devices and arrays of the magnetoelectric devices can be used for a variety of applications, including non-volatile memories (e.g., MRAM), magnetic field sensors, spintronics, tunable RF circuit elements, tunable optics, and biomedical devices.

The devices can be made with a simple two-terminal design that includes an island of magnetostrictive material that is strain-coupled to a thin layer ("film") of a piezoelectric material at an interface. A bottom electrode is placed in electrical communication with one surface of the piezoelectric film, and a top electrode is placed in electrical communication with a second, opposing surface of the piezoelectric film.

In some embodiments of the methods of using the devices, they are operated as a switchable memory bit. In other embodiments, they are operated as a magnetic field sensor. For memory applications, the bottom and top electrodes are configured to apply an out-of-plane electric field through the thickness of the piezoelectric film. For sensor applications, the bottom and top electrodes are configured to detect an out-of-plane electric field that is generated through the thickness of the piezoelectric film by an external magnetic field. In both embodiments, the out-of-plane electric field creates an elongated biased region in the film.

The top electrode in the devices is sized such that only a portion of the piezoelectric film is biased during operation. As a result, the elongated biased region is embedded in an unbiased region of the piezoelectric material. By applying a bias voltage that polarizes only a defined region of the piezoelectric film, the intrinsic isotropic in-plane strain state of the film in a memory device can be transformed by interaction with the surrounding unbiased piezoelectric material into the anisotropic strain state, which can be used to drive in-plane magnetic anisotropy in the strain-coupled magnetostrictive material and to control the in-plane magnetization orientation in the magnetostrictive island. Alternatively, when magnetic field sensor device is exposed to an external magnetic field, that field modulates (e.g., rotates) the in-plane magnetization orientation in the magnetostrictive island, thereby generating an out-of-plane electric field that can be detected by the top and bottom electrodes. Anisotropic strain is created inside and outside the biased region, although the nature of the strains will differ as discussed in greater detail in the Example. Therefore, the magnetostrictive island can be placed on the top electrode or adjacent to the top electrode.

The ability to induce or detect an in-plane, strain-driven magnetic reorientation in the magnetostrictive material associated with an out-of-plane electric field is advantageous because it enables the fabrication of dense, compact arrays of the magnetoelectric devices. Moreover, in some embodiments of the magnetoelectric devices, the piezoelectric film is free from substrate clamping so that in-plane strain can be freely generated in the film, resulting in large magnetoelectric coupling at low bias voltages. These advantages can be achieved without using complex electric field patterns generated by multiple (i.e., two or more) biasing electrodes or by domain-switching.

Figure 1A:
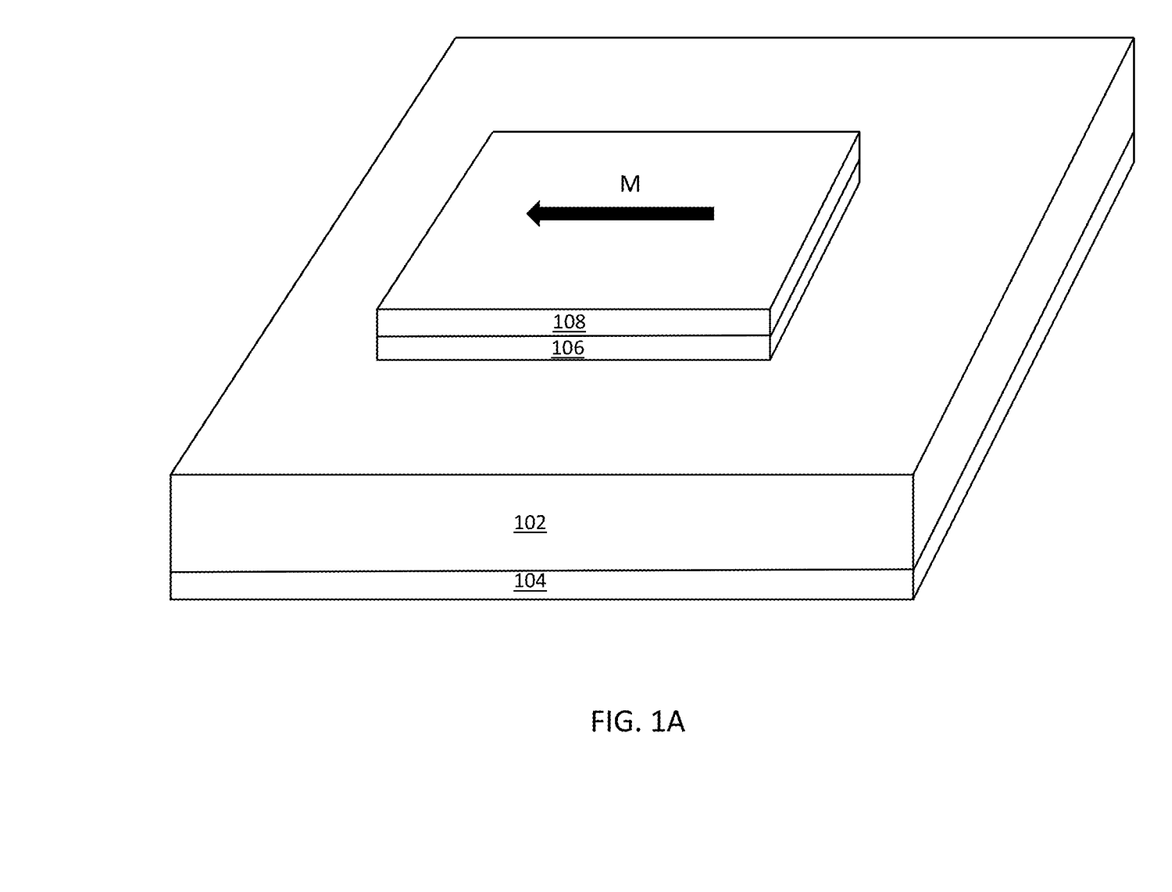
FIG. 1A is a schematic illustration on one embodiment of a magnetoelectric device that includes a magnetostrictive island on a top electrode.
Figure 1B:
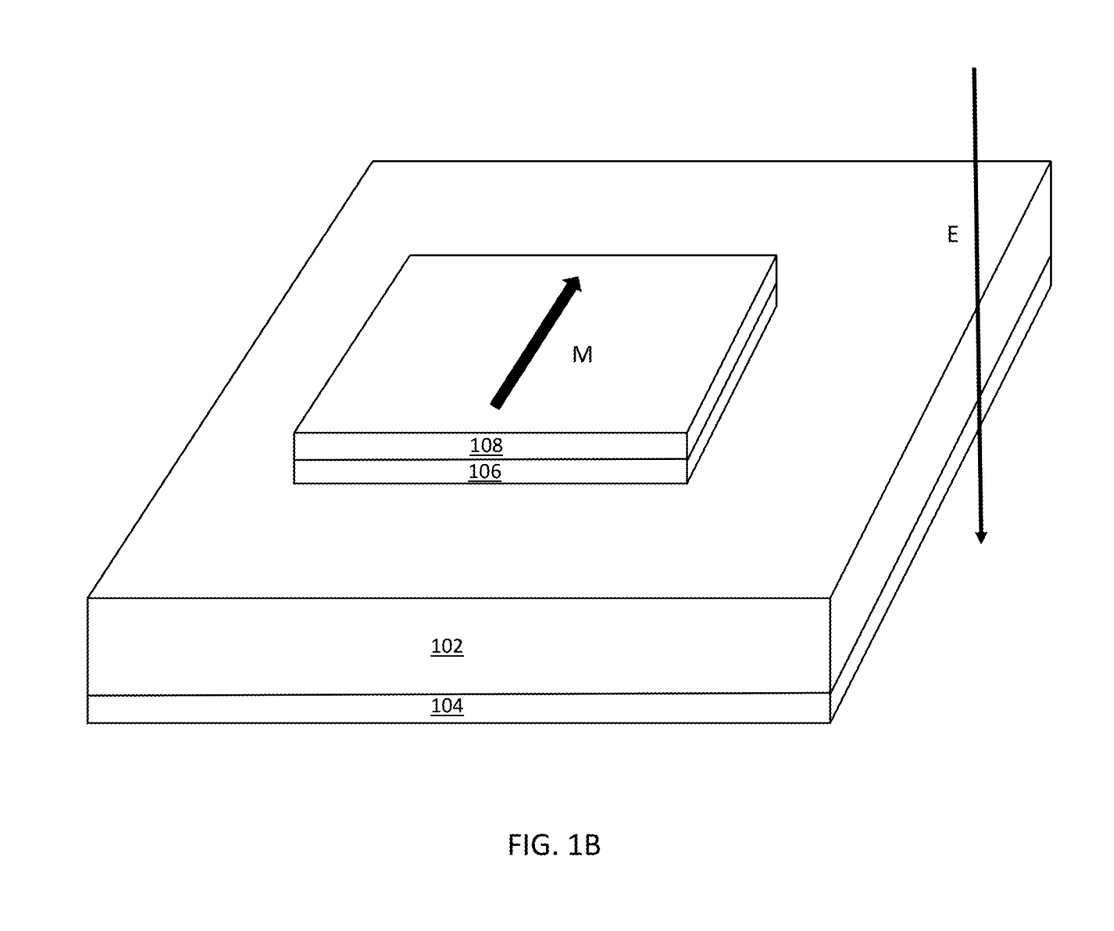
FIG. 1B shows the device after the application of a vertical electric field.

One embodiment of a magnetostrictive device is shown in FIG. 1A and FIG. 1B. The device includes a continuous piezoelectric film 102. The bottom surface of piezoelectric film 102 is in electrical communication with a continuous bottom electrode 104. A top electrode 106 is disposed on the opposite surface of piezoelectric film 102. The contact area between top electrode 106 and piezoelectric film 102 is substantially smaller than the contact area between bottom electrode 104 and piezoelectric film 102. The top electrode 106 is elongated so that it forms an elongated biased region in piezoelectric film 102 when an electric field is applied or induced across the bottom and top electrodes. As used herein, the term elongated means having an aspect ratio (length:width) that is greater than one, including aspect ratios of at least 1.2, at least 1.5, and at least 2. Thus, elongated electrodes and elongated biased regions are characterized by shape anisotropy and include rectangular and elliptical electrodes and biased regions. In the embodiment shown in FIG. 1A and FIG. 1B, a discrete thin layer of magnetostrictive material (an island 108) is strain-coupled to the piezoelectric film through the top rectangular electrode on which it is disposed. In this embodiment, magnetostrictive island 108 is a rectangular island having the same dimensions as the top electrode 106. However, the magnetostrictive island need not have the same shape and dimensions as the top electrode. The magnetostrictive island will typically be substantially thinner than the piezoelectric film. By way of illustration, the piezoelectric film may have a thickness in the range from 100 nm to 1000 nm, while the magnetostrictive island has a thickness in the range from 10 nm to 50 nm. However, thicknesses outside of these ranges can be used.

The effect of an applied electric field is illustrated in FIG. 1A and FIG. 1B for a device using a magnetostrictive material with a negative magnetostrictive constant. Initially, the direction of the magnetization (M) of the magnetostrictive material has a first orientation. When an out-of-plane electric field (E) is applied through the thickness of the piezoelectric film, the piezoelectric material in the elongated biased region undergoes an anisotropic strain. This anisotropic strain is shared with the overlying magnetostrictive material, and a magnetic easy axis is created along the direction of the highest compressive strain in the magnetostrictive island. As a result, the direction of magnetization (M) in the magnetostrictive island rotates in-plane to align with the easy axis. For example, for a magnetostrictive island having shape anisotropy, the magnetic bias field can be aligned along the major (i.e., long) axis of the island, such that M is initially aligned along the long axis (FIG. 1A). When a vertical (out-of-plane) electric field is applied through the piezoelectric film, a magnetic easy axis can be induced along the minor (i.e., short) axis via magnetoelasticity, and M rotates to align with the easy axis (FIG. 1). By sequentially applying and removing the electric field, the magnetization of the magnetostrictive material can be induced to undergo a reversible 90° rotation between the two axes. However, the rotation need not be a 90° rotation. Other degrees of rotation can be achieved.

FIG. 1A and FIG. 1B can also be used to represent a magnetic field sensor, wherein FIG. 1A represents the state of the magnetization (M) in the absence of an external magnetic field and FIG. 1B represents the change in the magnetization (M) direction in the presence of a magnetic field that induces an out-of-plane electric field (E) and generates a detectable voltage across the top and bottom electrodes. The voltage can be measured using a voltage measuring device, such as a voltmeter.

Figure 2A:
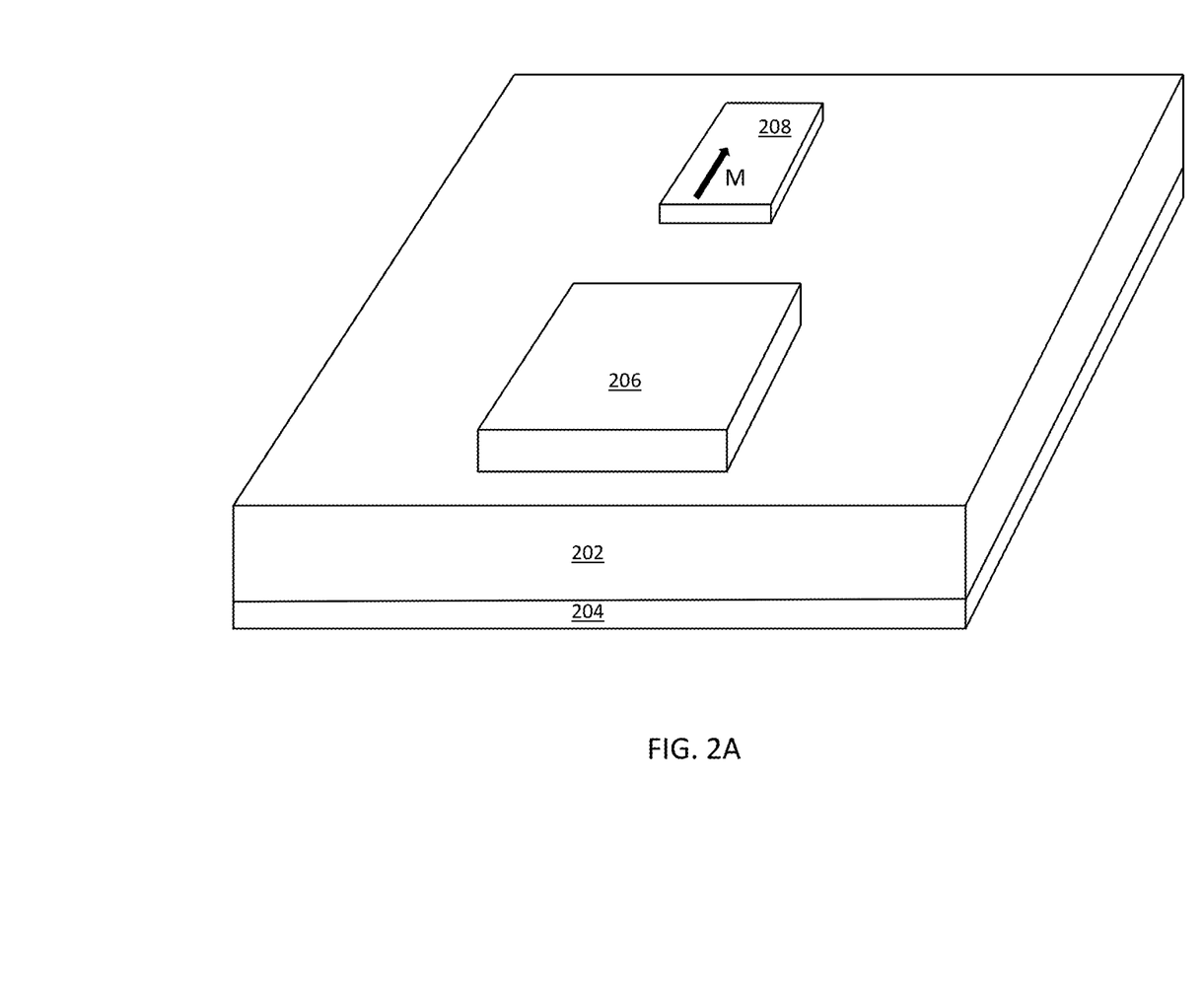
FIG. 2A is a schematic illustration on one embodiment of a magnetoelectric device that includes a magnetostrictive island adjacent to a top electrode.
Figure 2B:
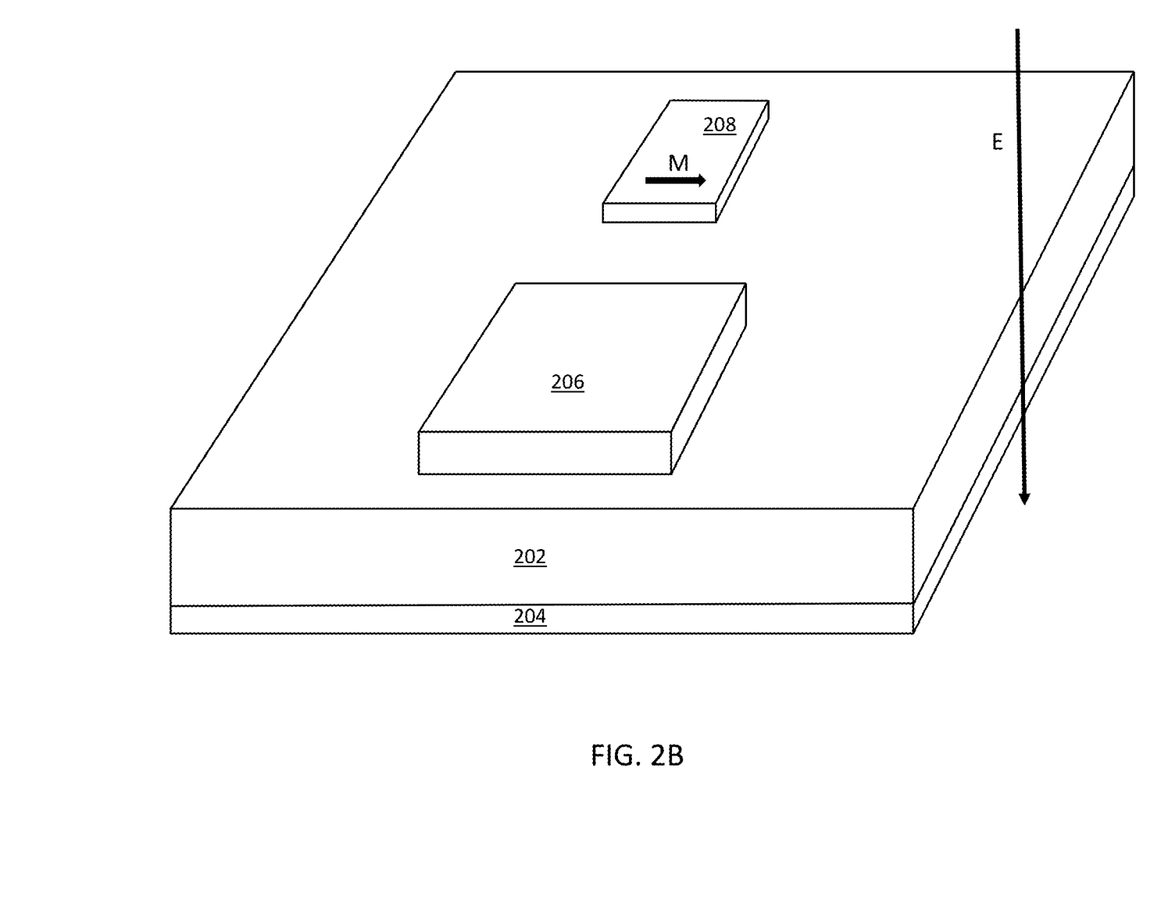
FIG. 2B shows the device after the application of a vertical electric field.

Another embodiment of a magnetostrictive device is illustrated in FIG. 2A and FIG. 2B. Like the device of FIG. 1A and FIG. 1B, this device uses a magnetostrictive material with a negative magnetostrictive constant. The device includes a continuous piezoelectric film 202. The bottom surface of piezoelectric film 202 is in electrical communication with a continuous bottom electrode 204. An unpaired top electrode 206 is disposed on the opposite surface of piezoelectric film 202. The top electrode 206 is rectangular so that it forms an elongated biased region in piezoelectric film 202 when an electric field is applied across the bottom and top electrodes. In the embodiment shown in FIG. 2A and FIG. 2B, a discrete thin layer of magnetostrictive material (an island 208) is disposed adjacent to top electrode 206 and is coupled directly to piezoelectric film 202.

During the operation of the device, the direction of magnetization (M) is initially oriented along a first direction. When an out-of-plane electric field (E) is applied through the thickness of the piezoelectric film, the piezoelectric material in the elongated biased region undergoes an anisotropic strain. In the embodiment shown in FIG. 2A and FIG. 2B, the unbiased region around the biased region is stretched toward the biased region and, thus, undergoes a tensile strain along its long axis and a compressive strain along its short axis. This strain is shared with the overlying magnetostrictive material, and a magnetic easy axis is created along the short axis of the magnetostrictive island. As a result, the direction of magnetization in the magnetostrictive island rotates in-plane to align with the easy axis. As shown in FIG. 2A and FIG. 2B, M initially may be aligned along the long axis (FIG. 2A). When a vertical electric field is applied through the piezoelectric film, a magnetic easy axis can be induced along the minor (i.e., short) axis via magnetoelasticity, and M rotates to align with the easy axis (FIG. 2B). By sequentially applying and removing the electric field, the magnetization of the magnetostrictive material can be induced to undergo a reversible rotation between the two axes.

Although the embodiments of the devices shown in the figures use magnetostrictive materials having a negative magnetostrictive constant, the devices could also be made using magnetostrictive material having a positive magnetostrictive constant; in this case, the easy axis would be created along the direction of the highest tensile strain, which is perpendicular to the direction of highest compressive strain. Thus, for a positive magnetostrictive material, M would be oriented 90° from the M directions shown in the figures, and the easy axis would be rotated by 90°.

Although it is not required, the piezoelectric films may be unclamped from the substrate on which they are grown and supported. Freeing the piezoelectric films in this way minimizes or eliminates the restriction of in-plane strain due to the clamping of the substrate and makes it possible to achieve large magnetoelectric coupling at low bias voltages. The unclamping of the piezoelectric material from its substrate can be accomplished by growing a layer of the piezoelectric material epitaxially on a growth substrate and subsequently removing the growth substrate using, for example, selective etching, as illustrated in the Example.

Following the removal of the growth substrate, a bottom electrode can be deposited directly on the exposed surface of the piezoelectric film.

Figure 3:
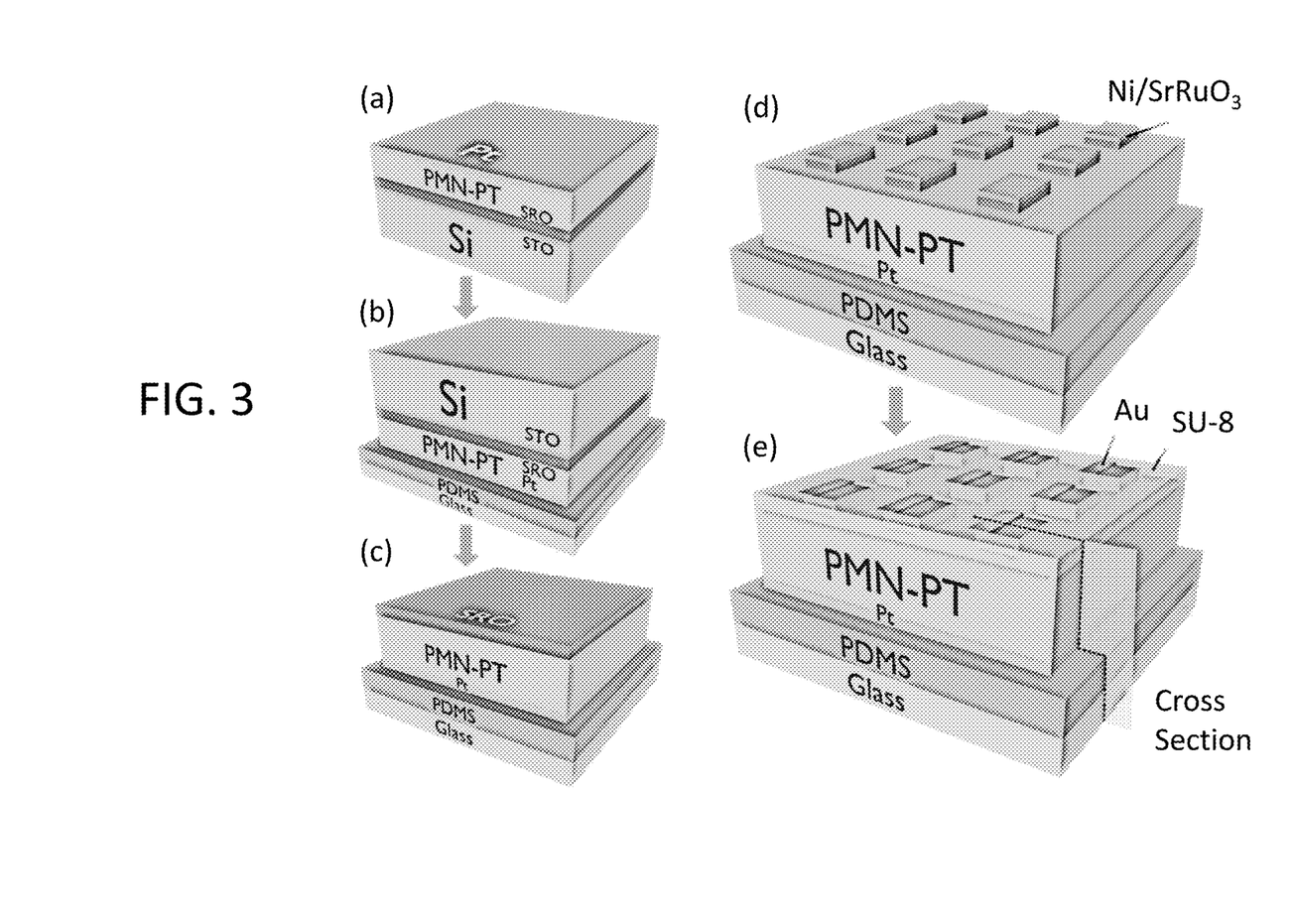
FIG. 3 depicts a schematic of the fabrication procedure for membrane magnetoelectric devices. Panel (a) shows the PMN-PT/SrRuO$_3$/SrTiO$_3$/Si thin-film heterostructure with Pt electrode. Panel (b) shows that the heterostructure was flipped and attached to polydimethylsiloxane (PDMS) coated glass. Panel (c) shows that Si and SrTiO$_3$ (STO) were etched off, leaving behind sub-micron membrane. Panel (d) shows that Ni was deposited and Ni/SrRuO$_3$ (SRO) was patterned into an array of devices. Panel (e) shows that a protective coating of SU-8 was applied and Au contacts were added. The indicated cross section is shown in FIG. 4A.

Arrays of the magnetoelectric devices can be fabricated for applications such as random-access memory arrays and sensor arrays. The arrays include a plurality of individually controllable magnetoelectric devices. In such arrays, each two-terminal magnetoelectric device can serve as a switchable memory bit or a discrete sensor. Notably, in each of the magnetoelectric devices, a single electrode pair consisting of the bottom electrode and a single top electrode induces or senses the anisotropic strain state in a biased region of the piezoelectric material and controls the magnetic anisotropy of the magnetostrictive island. Thus, the present devices are distinguishable from magnetoelectric devices that include more than one top electrode to define the electric field pattern, induce a magnetic anisotropy, and rotate the magnetization in a magnetostrictive material. In such devices each top electrode is paired with, and interacts with, one or more additional top electrodes during the operation of the device. In contrast, in the present devices, the out-of-plane electric field pattern in each device is controlled by only a top electrode together with a bottom electrode. Since the top electrode is not paired with one or more additional top electrodes, it is referred to as an "unpaired electrode". It should be understood, however, that the individual magnetoelectric devices in the array can share a common bottom electrode and a common piezoelectric layer, as illustrated in FIG. 3; in such embodiments, each top electrode paired with the bottom electrode would define an individual device within the array.

Some embodiments of the random-access memory devices include a magnetic tunnel junction (MTJ). An MTJ includes a lower ferromagnetic layer (the free layer), an upper ferromagnetic layer (the fixed layer), and a dielectric spacer layer that serves as a tunnel barrier between lower and upper ferromagnetic layers. In the MTJ-based memory devices, the magnetostrictive island provides the free layer. In these devices, the device resistance is determined by the relative magnetization alignment between the magnetostrictive free layer and the fixed layer. Thus, the strain-driven magnetization rotation in the magnetostrictive island that provides the free layer in the MTJ results in a change in the resistance of the device. Generally, the MTJ will be in a low resistance state when the magnetization of the free layer is aligned with the magnetization of the fixed layer and a high resistance state when the magnetization of the free layer and the magnetization of the fixed layer are in an antiparallel state. The MTJ-based memory device can be read by measuring the resistance of the MTJ using a resistance measuring device.

Piezoelectric materials that may be used to form the piezoelectric film include, but are not limited to, $[Pb(Mg_{1/3}Nb_{2/3})O_3]_{0.7}$—$[PbTiO_3]_{0.3}$ (PMN-PT) and similar relaxor $PbTiO_3$ mixtures, $PbZr_xTi_{1-x}O$, $BaTiO_3$, AlN, and ZnO. Magnetostrictive materials that may be used to form the magnetostrictive islands include ferromagnetics, such as nickel, cobalt, $Tb_xDy_{1-x}Fe_2$, and Metglas.

Example

Fabrication and Characterization

Figure 4A:
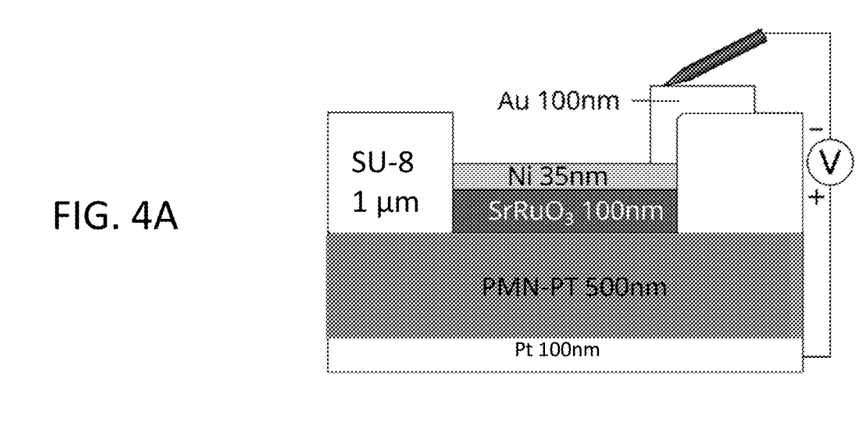
FIG. 4A depicts the cross-section schematic of a completed sample. Positive voltage corresponds to polarization towards the SrRuO$_3$.

The membrane fabrication process started from an epitaxial PMN-PT/$SrRuO_3$ bilayer on $SrTiO_3$-buffered Si, and resulted in a piezoelectric membrane heterostructure on a soft polymer (Polydimethylsiloxane [PDMS]) coated glass slide (FIG. 3, panels (a)-(e)). Growth of high quality epitaxial PMN-PT/SrRuO$_3$/SrTiO$_3$ heterostructures on 4° miscut (100)-oriented Si substrates has been previously reported (Baek S H, et al. (2011). *Science* 334:958-961.). A continuous Pt film sputtered onto the PMN-PT served as the bottom electrode. The structure was attached Pt side down to soft PDMS coated glass, and then the Si substrate was removed with a XeF$_2$ plasma etch, and the SiO$_2$ was removed by ion-milling. This left behind a sub-micron thick PMN-PT/SrRuO$_3$. The exposed SrRuO$_3$ was patterned into top electrodes, defining the PMN-PT biased regions. A 35 nm thick Ni layer was deposited and patterned into regions in which the magnetization rotation was probed via Magneto-optic Kerr Effect (MOKE) measurements. A protective coating of SU-8 polymer and an overlayer of patterned Au allowed probe tips to contact individual top electrodes. The cross section of the final heterostructure is shown in FIG. 4A.

Structural, ferroelectric and piezoelectric characterization of the PMN-PT was performed on thin-film and membrane samples. High-resolution X-ray diffraction shows that the biaxially strained thin film PMN-PT relaxed towards bulk lattice constants after substrate removal. Release from the substrate also resulted in a slight increase in the PMN-PT (002) rocking curve from 0.4° to 0.5° due to the lattice constant relaxation. According to polarization-electric field hysteresis loops, the PMN-PT had a remnant polarization of 20 µC/cm$^2$ and a ferroelectric imprint of 50 kV/cm, favoring the polarization pointing towards the SrRuO$_3$. The longitudinal piezoelectric response of the membrane was measured to be 1200 pm/V using a double-beam interferometer, comparable to that of 0.7PMN-0.3PT bulk single crystal samples (Sun E, et al. (2014). *Prog Mater Sci* 65:124-210.).

Figure 4B:
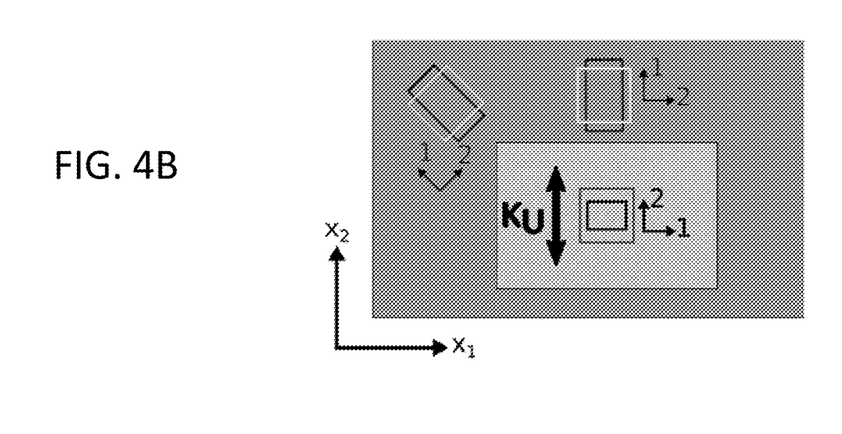
FIG. 4B depicts that biased regions with aspect ratio A≠1 generated excess strain along their shorter directions, which induced a magnetic easy direction (arrow). The strain distribution in both the biased (light gray) and unbiased (dark gray) regions can be considered in terms of local principal strains, shown with small axes indicating directions of principal strains $\varepsilon_1$ and $\varepsilon_2$. The grey squares represent undeformed infinitesimal patches, and the black rectangles represent the same patches after deformation due to the piezoelectric response.

A key aspect of the membranes is that the PMN-PT layer is continuous, with electrically biased regions (defined by patterned SrRuO$_3$ top electrodes) embedded in unbiased PMN-PT. A bias voltage applied between the continuous Pt bottom electrode and the patterned SrRuO$_3$ top electrode polarized only this defined region of the PMN-PT, and it was found that the intrinsic isotropic in-plane strain state was transformed by interaction with the surrounding unbiased PMN-PT into the anisotropic strain required to drive in-plane magnetic anisotropy. Anisotropic strain was present both inside and outside of the biased region, and the strain direction was spatially varying (FIG. 4B). This interaction is referred to as boundary clamping, and it has been shown that it can be used to design an electric-field induced strain that controls the in-plane magnetization orientation in the Ni regions. Measurements of membrane composite magneto-electrics show electric-field induced uniaxial anisotropy and are in good agreement with analytical and numerical analyses of the piezoelectric strain tensor in this constrained geometry.

Experimental Results

MOKE magnetic hysteresis loops were used to measure strain-induced magnetic anisotropy in the Ni at different PMN-PT bias voltages. Applying the magnetic field along an easy magnetic direction resulted in a square hysteresis loop as the magnetization jumped between orientations parallel and antiparallel to the applied field. Applied field along a hard direction rotated the magnetization away from the easy axis, resulting in a linear MOKE magnetic hysteresis loop with zero coercivity that saturated at an applied field H$_{sat}$. The uniaxial magnetic anisotropy energy density K$_U$ can be estimated from the hard axis data with $$K_U = \frac{\mu_0}{2} M_s H_{sat},$$

where M$_s$ is the Ni saturation magnetization, and assuming coherent rotation (Tannous C, et al. (2008). *Eur J Phys* 29:475-487.).

Figure 5A:
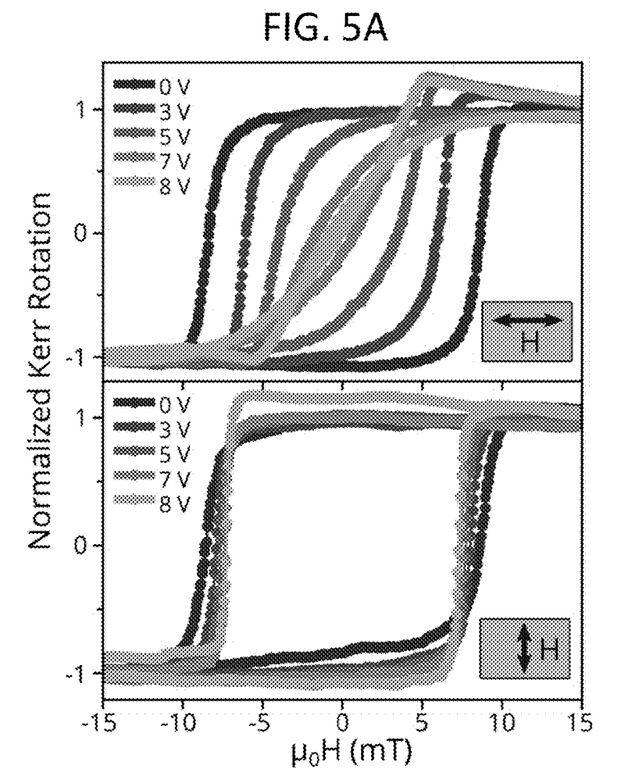
FIG. 5A depicts magnetic hysteresis loops with the applied magnetic field parallel (top panel) and perpendicular (bottom panel) to the long edge of the pattern.

FIG. 5A shows the bias dependence of MOKE hysteresis loops of a 300 µm by 200 µm Ni/SrRuO$_3$ rectangle that serves as top electrode for PMN-PT bias. In the top panel, the applied field magnetic field was along $\hat{x}_1$, parallel to the long edge of a rectangle. As the applied bias was increased from 0V to 8V, the loops closed from square to nearly linear, indicating the formation of a magnetic hard direction along $\hat{x}_1$ with an anisotropy energy of 1.2 kJ/m$^3$. In the bottom panel of FIG. 4A, the measurement field was rotated by 90° to be along $\hat{x}_2$, parallel to the shorter edge of the pattern. As the applied bias increased, there was a small change in coercive field but no noticeable change in loop shape, showing that the $\hat{x}_2$ axis remained easy, independent of bias. These two measurements confirm that the piezoelectric strain induced a new uniaxial anisotropy in the Ni layer along $\hat{x}_2$. As Ni has a negative magnetostriction constant, $\hat{x}_2$ must be the most compressively strained direction in the biased region. At zero bias, the hysteresis loops for both field directions (and all others measured but not shown) were identical, indicating no intrinsic anisotropy in this sample.

Figure 5B:
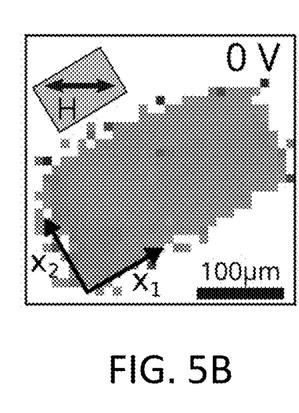
FIG. 5B depicts a map of coercive field ($H_C$) across a Ni island measured with MOKE at zero bias. No magnetic signal was detected at white pixels.
Figure 5C:
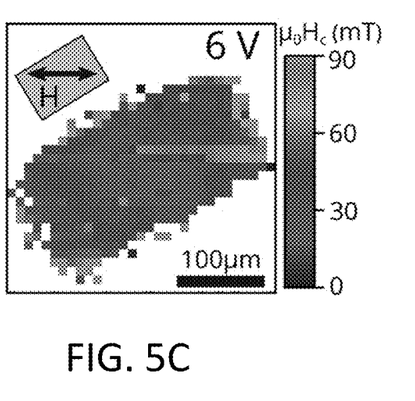
FIG. 5C depicts a coercive field map of the same island with a 6V applied bias.

FIG. 5B and FIG. 5C show spatial maps of the Ni coercivity measured with MOKE. A complete hysteresis loop was measured with the laser focused at each 10 µm×10 m pixel, and the magnetic field was aligned 30 from the previously determined strain-induced hard axis direction. At zero bias (FIG. 5B), the coercive field was uniform and matched the zero-bias coercive field measured in FIG. 5A. At a 6V bias (FIG. 5C), the coercive field dropped considerably, indicating loop closure and a strain-induced magnetic anisotropy. The loops did not close completely due to the 30° misalignment with the hard axis. The coercivity was lower near the center of the pattern and higher near the short edges, suggesting a larger anisotropy near the center of the electrode, as expected based on the analysis below.

Figure 6A:
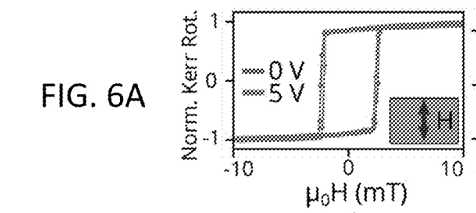
FIG. 6A-FIG. 6B depict MOKE hysteresis loops measured on Ni islands placed just inside (FIG. 6A) and outside (FIG. 6B) a 3:2 biased region at 0 V and 5 V bias and with the magnetic field along $\hat{x}_2$.
Figure 6B:
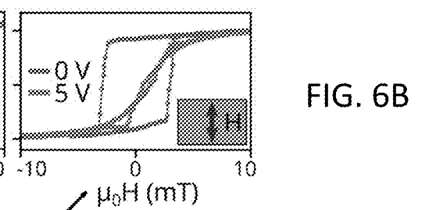

In addition to the strains within the biased region of the PMN-PT, there was also a significant strain outside of the biased region. The strain-induced magnetic anisotropies inside and outside of the biased region were qualitatively different. To probe this difference, a device was patterned with a grid of 60 µm by 80 µm Ni islands, each free to respond independently to local strains, placed on and around a 300 µm by 200 µm SrRuO$_3$ electrode. MOKE magnetic hysteresis loops are shown for two nearby Ni islands at 0V and 5V, one inside (FIG. 6A) and one outside (FIG. 6B) of the biased region. Both islands had square hysteresis loops at zero bias with the applied field along $\hat{x}_2$. At 5V, the Ni island inside the biased region had an unchanged hysteresis loop, matching the behavior of the larger Ni rectangle shown in FIG. 5A (bottom panel). The Ni island outside the biased region, under a 5V bias, developed an 0.84 kJ/m$^3$ anisotropy parallel to the long edge and perpendicular to the anisotropy induced inside the biased region. This 90° difference in anisotropy is consistent with the detailed analysis presented below, but it can also be understood qualitatively: when the biased PMN-PT compressed inwards, it stretched the unbiased region. The magnetization in the compressed region aligned parallel to the axis of compression (FIG. 6A, easy axis along $x_1$), and in the stretched region it aligned perpendicular to the axis of tension (FIG. 6B, easy axis along $x_2$).

DISCUSSION

The magnetoelectric measurements demonstrate that piezoelectric strain was responsible for inducing, via magnetoelasticity, a magnetic easy axis along the shorter direction of rectangular electrodes. This would not occur without the boundary clamping of the biased PMN-PT by the surrounding unbiased PMN-PT. Here an analysis was developed that related the piezoelectric strain, boundary clamping, and magnetic anisotropy, and which allowed for the design of an electric field-dependent magnetic anisotropy pattern in the Ni layer through piezoelectric tensor design.

A bias applied across the thickness of the PMN-PT generated strain in the PMN-PT through the converse piezoelectric effect. Normal (non-shear) strains in cubic piezoelectrics were characterized by two piezoelectric tensor components, $d_{33}>0$ and $d_{31}<0$, which in this geometry respectively describe the elongation parallel and perpendicular to the applied electric field. Because of its tetragonal symmetry when polarized along $\hat{x}_3$, an unconstrained sheet of PMN-PT responded equally along $\hat{x}_1$ and $\hat{x}_2$ (i.e. $d_{31}=d_{32}$), creating isotropic strain. However, when only a small region of the membrane was biased, its contraction was constrained by the surrounding unbiased PMN-PT, resulting in anisotropic response. It was found that the effect of this boundary clamping can be described with effective (subscript eff) piezoelectric tensor components of the biased region, with $d_{32,eff} \neq d_{31,eff}$. This modification led to strain-dependent uniaxial magnetic anisotropy.

This magnetic anisotropy induced by the applied bias depended on the in-plane components of the strain tensor, which were spatially varying due to the boundary clamping. Locally, every two-dimensional strain distribution had a direction of maximum strain and minimum strain, referred to as the first and second principal strain directions. The notation $\varepsilon_1$ and $\varepsilon_2$ is used here to denote the magnitude of the first and second principal strains. In terms of the principal strains, the induced anisotropy energy in the presence of an arbitrary strain distribution is $$K_U = -3/2\lambda_S Y_{Ni}(\varepsilon_1 - \varepsilon_2) \qquad (1)$$

where $\lambda_S$ and $Y_{Ni}$ are the saturation magnetostriction constant (−32.9 ppm) and Young's modulus (220 GPa) of polycrystalline Ni (C. Kittel (1949). *Rev Mod Phys* 21(4): 541-583.). This means that however complex the strain distribution, it locally induced a uniaxial anisotropy, with direction and magnitude determined by the principal strains of the strain tensor. Here, the anisotropy axis was parallel to the second principal strain direction because this is the most compressed direction, and Ni has a negative $\lambda_S$. FIG. 4B schematically shows the principal strains at three infinitesimal regions in the biased and unbiased regions of a piezoelectric membrane. Upon applying a bias, the gray (undeformed) square patches were stretched or compressed into the black rectangular patches, each with its own principal strain directions.

The strain difference $\varepsilon_1 - \varepsilon_2$ can be estimated at the center of the biased region from (1) using the values of $K_U$ from the MOKE hysteresis loops. Considering only strain-induced anisotropies, the hard axis measurement in FIG. 5A gives $\varepsilon_1 - \varepsilon_2 = 110$ ppm at 8 V bias, and that of FIG. 6B gives $\varepsilon_1 - \varepsilon_2 = 78$ ppm at 5V bias. The effective piezoelectric constants may also be estimated as the strain difference per applied electric field, giving $d_{31,eff} - d_{32,eff} = 6.9$ pm/V.

Analysis

It has been found that strain patterns in the piezoelectric membranes can be understood by building on a continuum elasticity theory to describe the elastic behavior of precipitates in materials (Eshelby J D (1957). *Proc R Soc Lond A* 241(1226). doi:10.1098/rspa.1957.0133.). An exactly ellipsoidal region embedded in an elastic media will strain anisotropically in response to an isotropic internal stress, with the strain exactly uniform inside the ellipsoid. The strain is largest along the shortest axis of the ellipsoid. This is in agreement with the experimental results: the biased regions in the samples underwent uniform stress from their piezoelectric response, and the MOKE measurements indicate that the largest compressive strain lay along the shorter axis of rectangular patterns.

Inside an infinite elliptical cylinder with axes a and b, respectively along $\hat{x}_1$ and $\hat{x}_2$, the strain response to an electric field along the cylinder axis is (Mura T (1987) *Micromechanics of Defects in Solids* (Martinus Nijhoff), pp 149-155. 2nd Ed.)

$$\varepsilon_{ij} = E_3 \frac{e_{31}}{(a+b) c_{11}} \begin{pmatrix} b & 0 \\ 0 & a \end{pmatrix} = E_3 \frac{e_{31}}{(1+A) c_{11}} \begin{pmatrix} 1 & 0 \\ 0 & A \end{pmatrix} \qquad (2)$$

where $\varepsilon_{ij}$ is the strain tensor, $E_3$ is the electric field, $e_{31}$ is the transverse piezoelectric coupling constant ($e_{ij}=c_{ik} d_{kl}$), and the aspect ratio $$A = \frac{b}{a}.$$

The resulting first and second principal strains are $\varepsilon_{11}$ (along $\hat{x}_1$) and $\varepsilon_{22}$ (along $\hat{x}_2$). The magnetic anisotropy induced by this strain distribution, as a function of aspect ratio and applied electric field, is found from equations (1) and (2) to be $$K_U = -\frac{3}{2}\lambda_S \, Y_{Ni} \, E_3^2 \frac{e_{31}}{c_{11}} \frac{1-A}{1+A}. \qquad (3)$$

Using bulk materials constants (Peng J, et al. (2005). *Mater Lett* 59:640-643.) in this model yields $K_U=1.1$ kJ/m³ for an 8 V bias across a 3:2 aspect ratio ellipse, close to the measured value 1.2 kJ/m³ for the rectangular electrodes used here. This order of magnitude agreement suggests that far inside the pattern edges, the aspect ratio primarily determines the effect of boundary clamping on the electric-field induced magnetic anisotropy. The magnitude of the magnetic anisotropy is independent of the absolute size of the biased region, suggesting that lateral electrode dimensions much smaller than the 100 μm scale used here would still be effective.

Figure 6C:
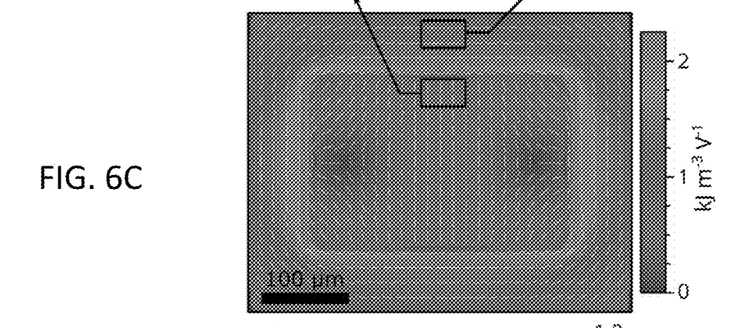
FIG. 6C depicts induced magnetic anisotropy per applied voltage on and around the biased region. Shading represents anisotropy energy, and the white lines are the anisotropy axis direction. Black rectangles indicate the experimentally probed regions.

Finite element continuum elastic simulations were performed to address the rectangular biased regions used in the experiments, mapping strains, and the resulting magnetic anisotropy (FIG. 6C). All layers of the structure shown in FIG. 4A except the Au and SU-8 were included in the simulation, using bulk values for the elastic, piezoelectric, and dielectric tensors of PMN-PT (Peng J, et al. (2005).). FIG. 6C shows the strain-induced magnetic anisotropy energy per applied voltage (shading) and anisotropy direction (white lines) on the surface of the PMN-PT layer. The computed anisotropy predominantly perpendicular to the long edge reproduced the experimental results of FIGS. 6A and 6B. The change in direction near the short edge coincided with very small anisotropy magnitude, and so it was difficult to detect experimentally. The computed 0.45 kJ m$^{-3}$V$^{-1}$ magnitude in the large central portion of the biased region predicted a 3.6 kJ/m$^3$ anisotropy energy density at 8V, about three times the experimental value. The computed anisotropy was largest near the center, consistent with the experimental spatial maps of FIG. 5C.

Figure 6D:
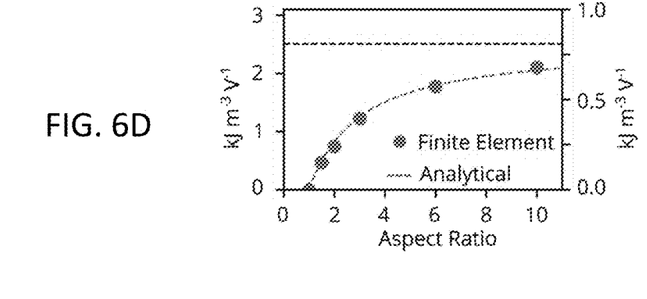
FIG. 6D depicts aspect ratio dependence of the simulated (circles, left axis) and Eshelby model (dotted lines, right axis) anisotropy energy inside elliptical biased regions. The asymptotic value is shown as a dashed black line.

A series of elliptical electrodes were also simulated with varying aspect ratios for comparison. FIG. 6D shows that the simulated and analytical anisotropy energies had the same $$\frac{A-1}{A+1}$$

dependence on aspect ratio. However, the analytic result of Eq. (3) describes an infinite cylinder of PMN-PT and the simulation of the experimental two-dimensional composite sheet. The two y-axis scales in FIG. 6D indicate that this difference resulted in different predicted anisotropy energy magnitudes, but the dependence on aspect ratio was captured by the analytic result.

According to finite element calculations, the area of largest uniaxial strain was just outside of the biased region boundary (FIG. 6C). Analytical solutions (Jaswon M A, et al., (1961). *Math Proc Cambridge Philos Soc* 57(3):669-680.) for the strain outside of elliptical precipitate inclusions confirm that the largest uniaxial strains were concentrated on the most curved portion of the boundary, and that the strains drop off like $1/|x|^2$ far from the boundary. The measured anisotropy directions of the Ni island outside the biased region (FIG. 6B) match the calculated anisotropy parallel to the long edge (FIG. 6C black boxed) and the direct phase-field calculation of the magnetization direction for those locations. A significant difference was not experimentally found in the induced anisotropy energy inside and outside of the biased region, likely due to pre-existing magnetic anisotropy and domain pinning in the Ni that makes H$_{sat}$ a coarse method for measuring anisotropy energy.

CONCLUSIONS

The preceding analysis led to a set of guidelines for setting magnetoelectric response in piezoelectric membrane composites using piezoelectric tensor design. An elongated single electrode generated, in its interior, uniaxial compressive strain and magnetic anisotropy that increased with aspect ratio, and were predominantly oriented along the short axis. Ellipsoidal biased regions had exactly uniform interior strains, with about sixty percent of the limiting anisotropy value obtained at an aspect ratio of 4:1. Substantial further increases required large increases in aspect ratio. Rectangular regions generated about 20% more uniaxial strain than ellipses of the same aspect ratio, but the strain was less uniform in rectangles. The maximum uniaxial tensile strain was located outside highly curved boundaries and was at least twice as large as the interior uniaxial strain, but at the cost of reduced spatial uniformity. In the case of a straight boundary, the exterior magnetic anisotropy was perpendicular to the interior anisotropy. These rules allowed for the design of particular anisotropy magnitudes and directions using boundary shape and layout.

Materials and Methods

Membrane Fabrication

FIG. 3 is the schematic of the fabrication procedure for the PMN-PT membrane devices. Here, the method will be described in detail. Growth of high quality PMN-PT (001) thin films started with a (001) Si wafer with a 4° miscut towards (110) and a 20 nm buffer layer of STO. First, 100 nm of SRO was grown using 90° off-axis rf-magnetron sputtering (Eom C B, et al. (1990). *Phys C Supercond its Appl* 171:354-382.) at 100 W power and 600° C. A mixture of Ar and O$_2$ gas, flown at 12 sccm and 8 sccm respectively, supplied a working pressure of 200 mTorr. PMN-PT films were then grown using a misaligned parallel dual planar magnetron sputtering technique (Brewer A, et al. (2017). *J Vac Sci Technol A Vacuum, Surfaces, Film* 35(6):060607-1-060607-6.) with substrate rotation with 100 W power at 625° C. A mixture of Ar and O$_2$ gas, flown at 17 sccm and 3 sccm respectively, supplied a working pressure of 500 mTorr for PMN-PT growth. A 100 nm layer of Pt was then deposited on top of PMN-PT by DC Magnetron sputtering. The heterostructure was annealed in O$_2$ at 300° C. for 30 minutes to reduce residual stress in the Pt film. The Si substrate was then mechanically polished to reduce the thickness from 300 µm down to 100 µm to reduce total etching time during the later XeF$_2$ dry etching. After polishing, Polydimethylsiloxane (PDMS), with a 10:1 mixture ratio of monomer to crosslinking agent, was spin-coated onto a glass slide at 5000 rpm for 10 s, resulting in a thickness of approximately 30 µm. The thin film heterostructure was then placed Pt-side down onto the uncured PDMS, leaving the Si substrate exposed, and the sample was placed under vacuum for a minimum of 5 hours to remove air bubbles from between the Pt and PDMS layers. After the vacuum treatment, the PDMS was then cured on a hot plate for 1 hour at 100° C.

Once the PDMS was cured, the sample was ready for Si removal. Prior to XeF$_2$ etching of Si, a 15 second plasma etch using CF$_4$ and O$_2$, flowing at 45 sccm and 5 sccm, respectively, to a pressure of 40 mTorr, was performed to remove any moisture on the sample, as well as any native SiO$_2$ present on the Si substrate. The Si substrate was then completely removed via XeF$_2$ etching. The XeF$_2$ etching system was performed in a SPTS Xetch el XeF$_2$ etcher system. The system exposed the samples to XeF$_2$ in a cyclic mode, and the recipe used here was chosen to maximize the etch rate for complete removal of the Si substrate. The recipe exposed the samples to 4 Torr of XeF$_2$ for two-minute periods, followed by pumping down to 0.8 Torr between cycles for a continuous etch before the next cycle began. Due to the exothermic nature of the reaction of XeF$_2$ with Si, the pressure in the chamber rose during the two-minute etch cycles. When the Si was completely removed, the pressure increase was notably absent during an etch cycle, signaling that the etching was complete.

After Si removal, the STO buffer layer was removed via Ar$^+$ ion-milling. The SRO layer was then patterned into various geometries using photolithography and wet etching with a 0.4 M NaIO$_4$ solution. A 35 nm layer of Ni was deposited by DC Magnetron sputtering, and photolithography was performed to pattern the Ni with a Transene Ni Etchant Type 1 wet etchant. A SU-8 protection layer was applied by spin-coating at 5000 rpm for 40 s, resulting in a thickness of 2 µm, followed by photolithography patterning. Finally, 30 nm of Au was deposited via DC Magnetron sputtering and patterned via photolithography, and Transene TFA Au wet etchant was used to make the "lifted" Au electrodes.

Finite-Element Simulations

Finite element calculations were performed with COMSOL Multiphysics™. Simulations were performed using the layers and thicknesses from FIG. 4A. The sheets of PMN-PT and back electrode were 1.4 μm in diameter to simulate a small biased region surrounded by a large unpolarized membrane. No mechanical constraints were applied to any surfaces, simulating an unconstrained membrane. The stiffness tensor and piezoelectric coefficients used for PMN-PT may be found in Table 2 of reference (Peng J, et al. (2005).). The stress-charge form of the piezoelectric constitutive relations was used:

$$\nabla \cdot D_i = \rho_f$$

$$\nabla \cdot \sigma_{ij} = 0$$

$$D_i = e_{ikl}\varepsilon_{kl} + \varepsilon_0 \kappa_{ij} E_j$$

$$\sigma_{ij} = c_{ijkl}\varepsilon_{kl} - e_{kij}E_k$$

where $D_i$, $E_i$, $\sigma_{ij}$, $\varepsilon_{kl}$, $\rho_f$, $e_{ijk}$, $c_{ijkl}$, $\kappa_{ij}$ are the electric displacement, electric field, stress tensor, strain tensor, free charge density, piezoelectric coupling tensor, stiffness tensor, and relative permittivity, respectively.

Longitudinal MOKE Measurements

The sample was mounted between the poles of an electromagnet, and a red HeNe (632 nm) laser was reflected off of the sample surface at approximately 45° from normal incidence. The beam was focused to an approximately 10 μm spot using an achromat. The reflected beam's polarization was rotated to 45° from p-polarized with a half-wave plate, and then the s- and p-polarized components were measured with a differential balanced photodetector. The differential signal was proportional to the Kerr polarization rotation. Spatial mapping was achieved by mounting the sample on a two-axis linear piezoelectric motion stage and scanning the sample under the focused beam.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A magnetoelectric device comprising:
   a layer of piezoelectric material having a first surface and a second surface, wherein the first surface is disposed opposite the second surface;
   an island of magnetostrictive material that is strain-coupled to the layer of piezoelectric material;
   a bottom electrode in electrical communication with the first surface of the layer of piezoelectric material; and
   an unpaired top electrode in electrical communication with the second surface of the layer of piezoelectric material, wherein the island of magnetostrictive material is disposed on the unpaired top electrode or wherein the island of magnetostrictive material is disposed adjacent to the unpaired top electrode and the island of magnetostrictive material and the adjacent unpaired top electrode are both disposed on the second surface of the layer of piezoelectric material, and further wherein the bottom electrode and the unpaired top electrode are configured to apply or to detect an electric field through a thickness of the layer of piezoelectric material in a biased region in the layer of piezoelectric material, wherein the biased region in the piezoelectric material has an aspect ratio greater than one and is embedded in and surrounded around all lateral sides by an unbiased region in the layer of the piezoelectric material.

2. The magnetoelectric device of claim 1, wherein the island of magnetostrictive material is disposed on the unpaired top electrode.

3. The magnetoelectric device of claim 1, wherein the island of magnetostrictive material is disposed adjacent to the unpaired top electrode.

4. The magnetoelectric device of claim 1, further comprising a substrate, wherein the layer of piezoelectric material is not clamped to a substrate.

5. The magnetoelectric device of claim 1, wherein the piezoelectric material is $Pb(Mg_{1/3}Nb_{2/3})O_3]_{0.7}$—$[PbTiO_3]_{0.3}$.

6. The magnetoelectric device of claim 1, wherein the bottom electrode and the unpaired top electrode are configured to apply the electric field through the thickness of the layer of piezoelectric material in the biased region.

7. The magnetoelectric device of claim 1, wherein the bottom electrode and the unpaired top electrode are configured to detect the electric field through the thickness of the layer of piezoelectric material in the biased region.

8. The magnetoelectric device of claim 1, wherein the layer of piezoelectric material has a thickness in the range from 100 nm to 1 μm.

9. The magnetoelectric device of claim 8 further comprising a substrate underlying the bottom electrode, wherein the substrate does not prevent in-plane strain from being freely generated in the layer of piezoelectric material.

10. The magnetoelectric device of claim 9, wherein the substrate comprises a polymer and the bottom electrode is on the polymer.

11. A magnetoelectric device array comprising:
    a plurality of magnetoelectric devices, each magnetoelectric device in the plurality comprising:
    a layer of piezoelectric material having a first surface and a second surface, wherein the first surface is disposed opposite the second surface;
    an island of magnetostrictive material that is strain-coupled to a layer of piezoelectric material;
    a bottom electrode in electrical communication with the first surface of the layer of piezoelectric material; and
    an unpaired top electrode in electrical communication with the second surface of the layer of piezoelectric material, wherein the island of magnetostrictive material is disposed on the unpaired top electrode or wherein the island of magnetostrictive material is disposed adjacent to the unpaired top electrode and the island of magnetostrictive material and the adjacent unpaired top electrode are both disposed on the second surface of the layer of piezoelectric material, and further wherein the bottom electrode and the unpaired top electrode are configured to apply or to detect an electric field through a thickness of the layer of piezoelectric material in a biased region in the layer of piezoelectric material, wherein the biased region in the piezoelectric material has an aspect ratio greater than one and is embedded in and surrounded around all lateral sides by an unbiased region in the layer of the piezoelectric material.

12. A method of reorienting the direction of magnetization in a magnetostrictive material in a device comprising:
a bilayer comprising:
a layer of piezoelectric material having a first surface and a second surface, wherein the first surface is disposed opposite the second surface; and
an island of magnetostrictive material that is strain-coupled to the layer of piezoelectric material,
a bottom electrode in electrical communication with the first surface of the layer of piezoelectric material; and
an unpaired top electrode in electrical communication with the second surface of the layer of piezoelectric material, wherein the island of magnetostrictive material is disposed on the unpaired top electrode or wherein the island of magnetostrictive material is disposed adjacent to the unpaired top electrode and the island of magnetostrictive material and the adjacent unpaired top electrode are both disposed on the second surface of the layer of piezoelectric material, and further wherein the bottom electrode and the unpaired top electrode are configured to apply the out-of-plane electric field through a thickness of the layer of piezoelectric material,
the method comprising:
applying an out-of-plane electric field through the thickness of the layer of piezoelectric material, wherein the application of the out-of-plane electric field creates a biased region having an aspect ratio greater than one embedded in the layer of piezoelectric material and surrounded on all lateral sides by an unbiased region in the layer of piezoelectric material and induces the direction of magnetization in the magnetostrictive material to undergo an in-plane rotation from a first in-plane direction to a second in-plane direction.

13. The method of claim 12, wherein the island of magnetostrictive material is disposed on the unpaired top electrode.

14. The method of claim 12, wherein the island of magnetostrictive material is disposed adjacent to the unpaired top electrode.

15. The method of claim 12, wherein the layer of piezoelectric film is not clamped to a substrate.

16. The method of claim 12, wherein the piezoelectric material is $Pb(Mg_{1/3}Nb_{2/3})O_3]_{0.7}$—$[PbTiO_3]_{0.3}$.

17. The method of claim 12, wherein the in-plane rotation is a 90° in-plane rotation.

18. A method of sensing the direction of magnetization in a magnetostrictive material in a device comprising:
a bilayer comprising:
a layer of piezoelectric material having a first surface and a second surface, wherein the first surface is disposed opposite the second surface; and
an island of magnetostrictive material that is strain-coupled to the layer of piezoelectric material,
a bottom electrode in electrical communication with the first surface of the layer of piezoelectric material; and
an unpaired top electrode in electrical communication with the second surface of the layer of piezoelectric material, wherein the island of magnetostrictive material is disposed on the unpaired top electrode or wherein the island of magnetostrictive material is disposed adjacent to the unpaired top electrode and the island of magnetostrictive material and the adjacent unpaired top electrode are both disposed on the second surface of the layer of piezoelectric material, and further wherein the bottom electrode and the unpaired top electrode are configured to apply the out-of-plane electric field through a thickness of the layer of piezoelectric material,
the method comprising:
exposing the magnetostrictive material to an external magnetic field that rotates the direction of magnetization in the plane of the magnetostrictive material, inducing an out-of-plane electric field through the thickness of the layer of piezoelectric material, wherein the out-of-plane electric field creates a biased region having an aspect ratio greater than one embedded in the layer of piezoelectric material and surrounded on all lateral sides by an unbiased region in the layer of piezoelectric material; and
detecting the out-of-plane electric field.

19. The method of claim 18, wherein the island of magnetostrictive material is disposed on the unpaired top electrode.

20. The method of claim 18, wherein the island of magnetostrictive material is disposed adjacent to the unpaired top electrode.

21. The method of claim 18, wherein the layer of piezoelectric film is not clamped to a substrate.

22. The method of claim 18, wherein the piezoelectric material is $Pb(Mg_{1/3}Nb_{2/3})O_3]_{0.7}$—$[PbTiO_3]_{0.3}$.

23. The method of claim 18, wherein the rotation in the direction of magnetization is a 90° in-plane rotation.

* * * * *

UNITED STATES PATENT AND TRADEMARK OFFICE
CERTIFICATE OF CORRECTION

PATENT NO. : 11,189,780 B2
APPLICATION NO. : 16/387898
DATED : November 30, 2021
INVENTOR(S) : Chang-Beom Eom et al.

Page 1 of 1

It is certified that error appears in the above-identified patent and that said Letters Patent is hereby corrected as shown below:

On the Title Page

Item (72), Line 4:
Delete the phrase "Shane Martin Lindeman," and replace with --Shane Martin Lindemann,--.

In the Specification

Column 8, Lines 32-33:
Delete the phrase "10 μm × 10 m" and replace with --10 μm × 10 μm--.

Signed and Sealed this
Twentieth Day of September, 2022

Katherine Kelly Vidal
*Director of the United States Patent and Trademark Office*